(12) United States Patent
Lim et al.

(10) Patent No.: US 9,129,953 B2
(45) Date of Patent: Sep. 8, 2015

(54) METHOD OF MAKING A GATE STRUCTURE

(71) Applicant: TAIWAN SEMICONDUCTOR MANUFACTURING COMPANY, LTD., Hsinchu (TW)

(72) Inventors: Peng-Soon Lim, Johor (MY); Da-Yuan Lee, Jhubei (TW); Kuang-Yuan Hsu, FongYuan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/300,867

(22) Filed: Jun. 10, 2014

(65) Prior Publication Data
US 2014/0295659 A1  Oct. 2, 2014

Related U.S. Application Data

(63) Continuation of application No. 12/643,414, filed on Dec. 21, 2009, now Pat. No. 8,779,530.

(51) Int. Cl.
*H01L 21/3205* (2006.01)
*H01L 29/49* (2006.01)
(Continued)

(52) U.S. Cl.
CPC ........ *H01L 29/4966* (2013.01); *H01L 29/4983* (2013.01); *H01L 29/512* (2013.01);
(Continued)

(58) Field of Classification Search
CPC ... H01L 29/4966; H01L 29/512; H01L 29/78; H01L 29/66545
See application file for complete search history.

(56) References Cited

U.S. PATENT DOCUMENTS 7,112,851 B2   9/2006  Saenger et al.
8,039,381 B2  10/2011  Yeh et al.
(Continued)

FOREIGN PATENT DOCUMENTS

CN   101438389   5/2009
JP    2008124427   5/2008
(Continued)

OTHER PUBLICATIONS

Office Action dated Jan. 14, 2013 from corresponding application No. TW 099114020.
(Continued)

*Primary Examiner* — Whitney T Moore
*Assistant Examiner* — Joseph Galvin, III
(74) *Attorney, Agent, or Firm* — Lowe Hauptman & Ham, LLP

(57) ABSTRACT

A method of making a gate structure includes forming a trench in a dielectric layer. The method further includes forming a gate dielectric layer in the trench. The gate dielectric layer defines an opening in the dielectric layer. The method includes forming a gate electrode in the opening. Forming the gate electrode includes filling a width of a bottom portion of the opening with a first metal material. The first metal material has a recess. Forming the gate electrode includes filling an entire width of a top portion of the opening with a homogeneous second metal material. The homogeneous second metal material has a protrusion extending into the recess, and a maximum width of the homogeneous second metal material is equal to a maximum width of the first metal material. A top surface of the gate dielectric layer is co-planar with a top surface of the homogeneous second metal material.

20 Claims, 10 Drawing Sheets

(51) Int. Cl.
H01L 29/66 (2006.01)
*H01L 21/8238* (2006.01)
*H01L 29/51* (2006.01)

(52) U.S. Cl.
CPC ... H01L29/66545 (2013.01); *H01L 21/823842* (2013.01); *H01L 29/495* (2013.01); *H01L 29/513* (2013.01); *H01L 29/517* (2013.01)

(56) References Cited

U.S. PATENT DOCUMENTS

| | | |
|---|---|---|
| 2001/0049183 A1 | 12/2001 | Henson et al. |
| 2007/0262451 A1* | 11/2007 | Rachmady et al. ........... 257/758 |
| 2008/0135952 A1 | 6/2008 | Brask et al. |
| 2008/0185637 A1* | 8/2008 | Nagaoka et al. .............. 257/327 |

FOREIGN PATENT DOCUMENTS

| | | |
|---|---|---|
| JP | 2008218962 | 9/2008 |
| KR | 1020060104213 | 10/2006 |
| TW | 478050 | 3/2002 |

OTHER PUBLICATIONS

Office Action dated Jan. 29, 2013 from corresponding application No. JP 2010-281727.
Office Action from corresponding application No. CN201010185547.5, dated Aug. 1, 2012.
Office Action with English Translation, dated Apr. 12, 2012 from corresponding application No. KR 10-2010-0066329.

* cited by examiner

METHOD OF MAKING A GATE STRUCTURE

PRIORITY CLAIM

The present application is a continuation of U.S. application Ser. No. 12/643,414, filed Dec. 21, 2009, the disclosure of which is incorporated herein by reference in its entirety.

FIELD OF THE INVENTION

The invention relates to integrated circuit fabrication, and more particularly to a method of making a gate structure.

BACKGROUND

As the dimensions of transistors decrease, the thickness of the gate oxide must be reduced to maintain performance with the decreased gate length. However, in order to reduce gate leakage, high dielectric constant (high-k) gate dielectric layers are used which allow greater physical thicknesses while maintaining the same effective thickness as would be provided by a typical gate oxide used in larger technology nodes.

Additionally, as technology nodes shrink, in some integrated circuit (IC) designs, there has been a desire to replace the typically poly-silicon gate electrode with a metal gate electrode to improve device performance with the decreased feature sizes. One process of forming the metal gate electrode is termed "gate last" process in which the final metal gate electrode is fabricated "last" which allows gate electrode to bypass some high-temperature processes, such as S/D anneal.

FIG. 1 shows a cross-sectional view of a conventional gate structure 120 for a Field Effect Transistor (FET) 100 fabricated by a "gate last" process. The FET 100 can be formed over an active region 103 of the substrate 102 adjacent to isolation regions 104. The FET 100 includes source/drain regions 106 and lightly doped regions 108 formed in the active region 103 of the substrate 102, a gate structure 120 comprising an interfacial layer 122, a gate dielectric layer 124 and a multilayered metal gate electrode 120a sequentially formed over the substrate 102 and gate spacers 110 respectively formed on both sidewalls of the gate structure 120. Additionally, a contact etch stop layer (CESL) 112 and an interlayer dielectric (ILD) layer 114 may also be formed over the substrate 102.

The multilayered metal gate electrode 120a comprises a lower portion 126 and an upper portion 128 sequentially formed over the gate dielectric layer 124. The lower portion 126 is formed of a first metal material acting as a work-function metal layer and having a first resistance. The upper portion 128 is formed of a second metal material acting as an interconnection metal layer and having a second resistance lower than the first resistance. Since the upper portion 128 with lower resistance occupies a small ratio of the multilayered metal gate electrode 120a by area, it has been observed that the multilayered metal gate electrode 120a exhibit high gate resistance, which can increase RC delay of the circuit and degrade device performance.

Accordingly, what is needed is a metal gate electrode of a gate structure having lower gate resistance.

SUMMARY

One aspect of this description relates to a method of making a gate structure. The method includes forming a trench in a dielectric layer. The method further includes forming a gate dielectric layer in the trench. The gate dielectric layer defines an opening in the dielectric layer. The method further includes forming a gate electrode in the opening. Forming the gate electrode includes filling a width of a bottom portion of the opening with a first metal material having a first resistance, wherein the first metal material has a recess. Forming the gate electrode further includes filling an entire width of a top portion of the opening with a homogeneous second metal material having a second resistance less than the first resistance, wherein the homogeneous second metal material has a protrusion extending into the recess, and a maximum width of the homogeneous second metal material is equal to a maximum width of the first metal material. A top surface of the gate dielectric layer is co-planar with a top surface of the homogeneous second metal material.

Another aspect of this description relates to a method of making a transistor. The method includes forming a trench in a dielectric layer exposing an active region of a substrate. The method further includes forming a gate structure in the trench. Forming the gate electrode includes forming a gate dielectric in the trench. Forming the gate electrode further includes filling a width of a bottom portion of the trench with a first metal material and having a first resistance, wherein the first metal material comprises a recess. Forming the gate electrode further includes filling an entire width of the trench above the first metal material with a homogeneous second metal material and having a second resistance less than the first resistance. The homogeneous second metal material comprises a protrusion extending into the recess, and a thickness of the protrusion is equal to a thickness at a periphery of the homogeneous second metal material. A maximum width of the homogeneous second metal material is equal to a maximum width of the first metal material, and a top surface of the gate dielectric is co-planar with a top surface of the homogeneous second metal material.

Still another aspect of this description relates to a method of making a gate structure. The method includes forming a trench in a layer over a substrate. The method further includes forming a gate structure in the trench. Forming the gate structure includes forming a lower portion of a gate electrode filling a width of a bottom portion of the trench, the lower portion comprising a first metal material having a first resistance, wherein a central portion of the lower portion has a thickness at least 50% less than a thickness of a peripheral portion of the lower portion located adjacent sidewalls of the trench. Forming the gate structure further includes forming an upper portion of the gate electrode filling an entire width of a top portion of the trench, the upper portion comprising a homogeneous second metal material having a second resistance lower than the first resistance, wherein a maximum width of the upper portion of the gate electrode is equal to a maximum width of the lower portion of the gate electrode. The method further includes forming a gate dielectric layer surrounding the gate electrode, wherein a top surface of the gate dielectric layer is co-planar with a top surface of the homogeneous second metal material.

A detailed description is given in the following embodiments with reference to the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples of a "gate last" metal gate process, however, one skilled in the art may recognize applicability to other processes and/or use of other materials.

Figure 2:
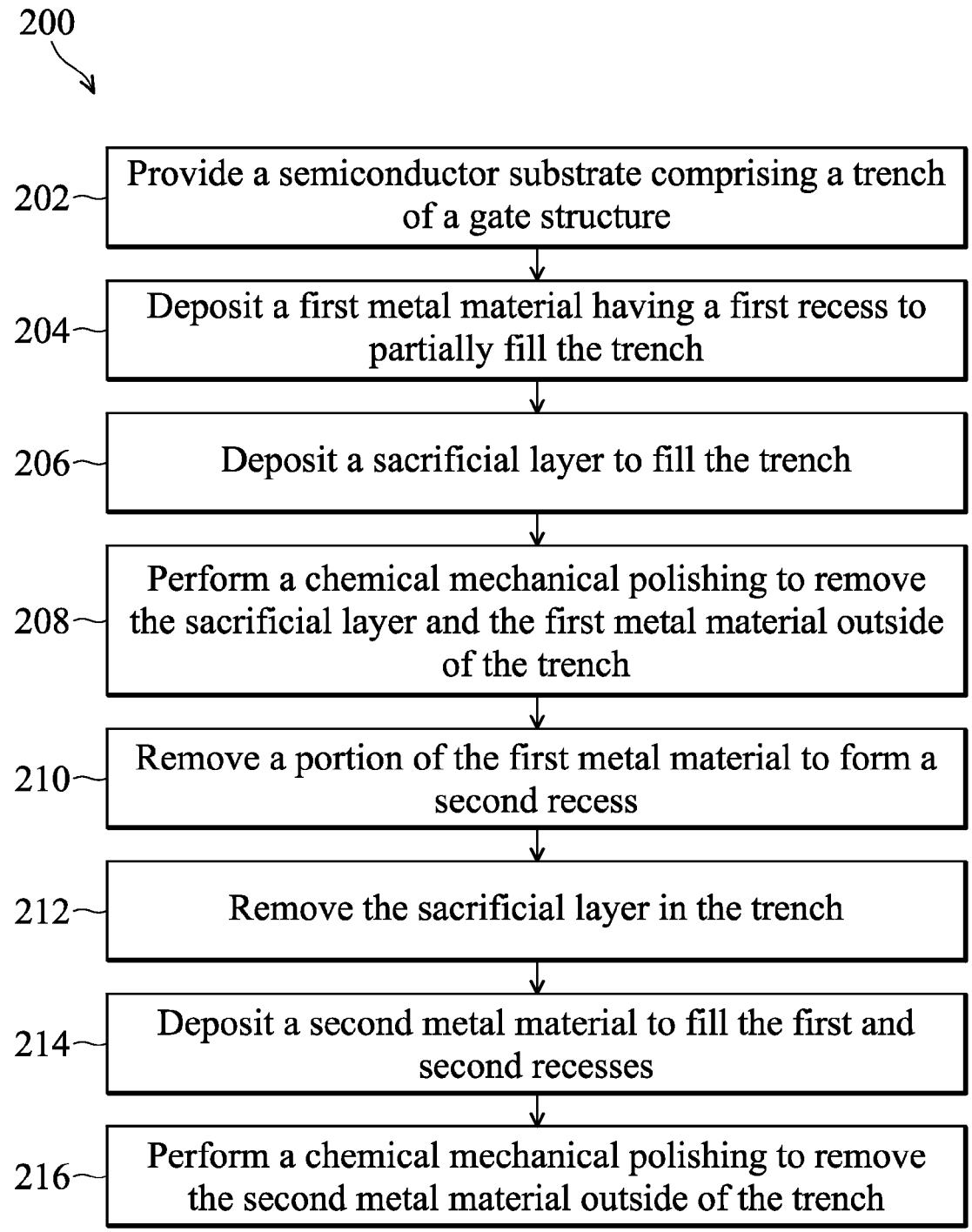
FIG. 2 is a flowchart illustrating a method for fabricating a gate structure according to various aspects of the present disclosure.
Figure 3A:
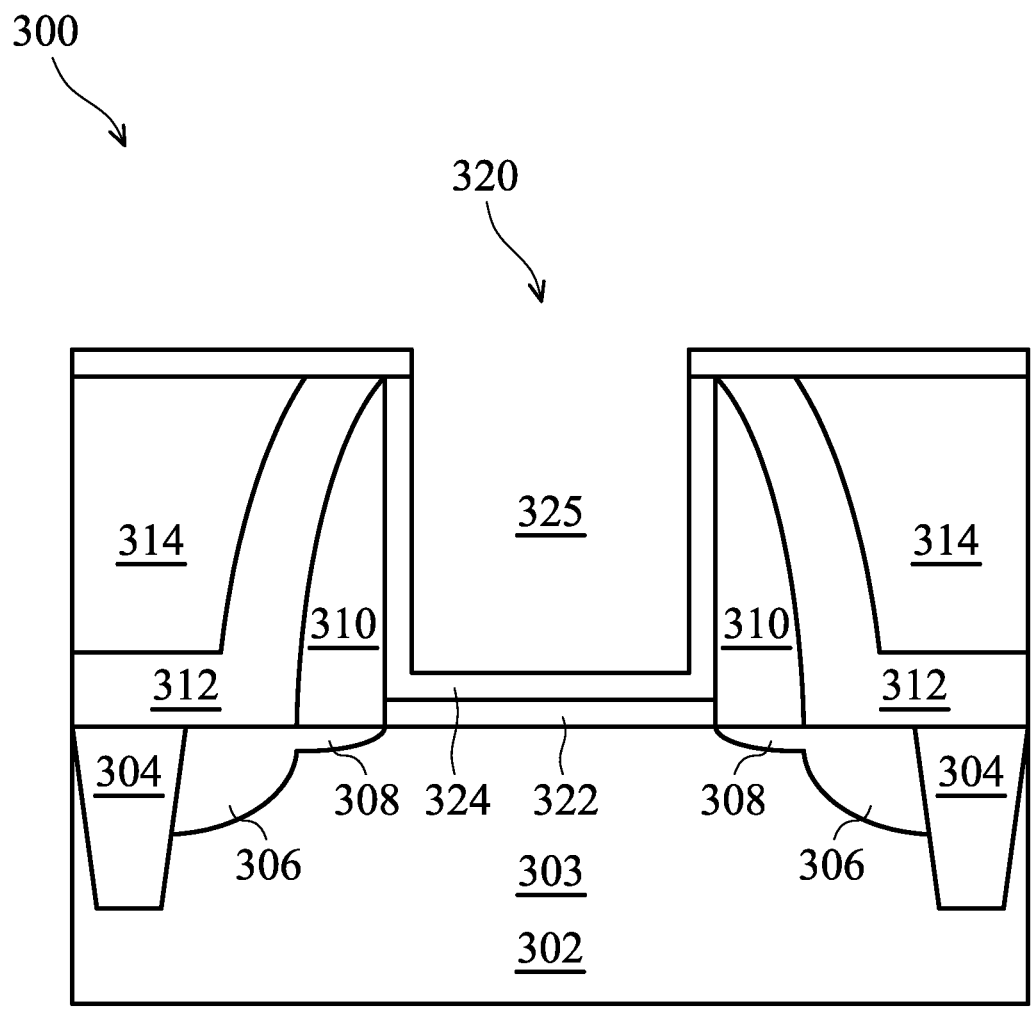
FIGS. 3A-H show schematic cross-sectional views of a gate structure at various stages of fabrication according to an embodiment of the method of FIG. 2.
Figure 3B:
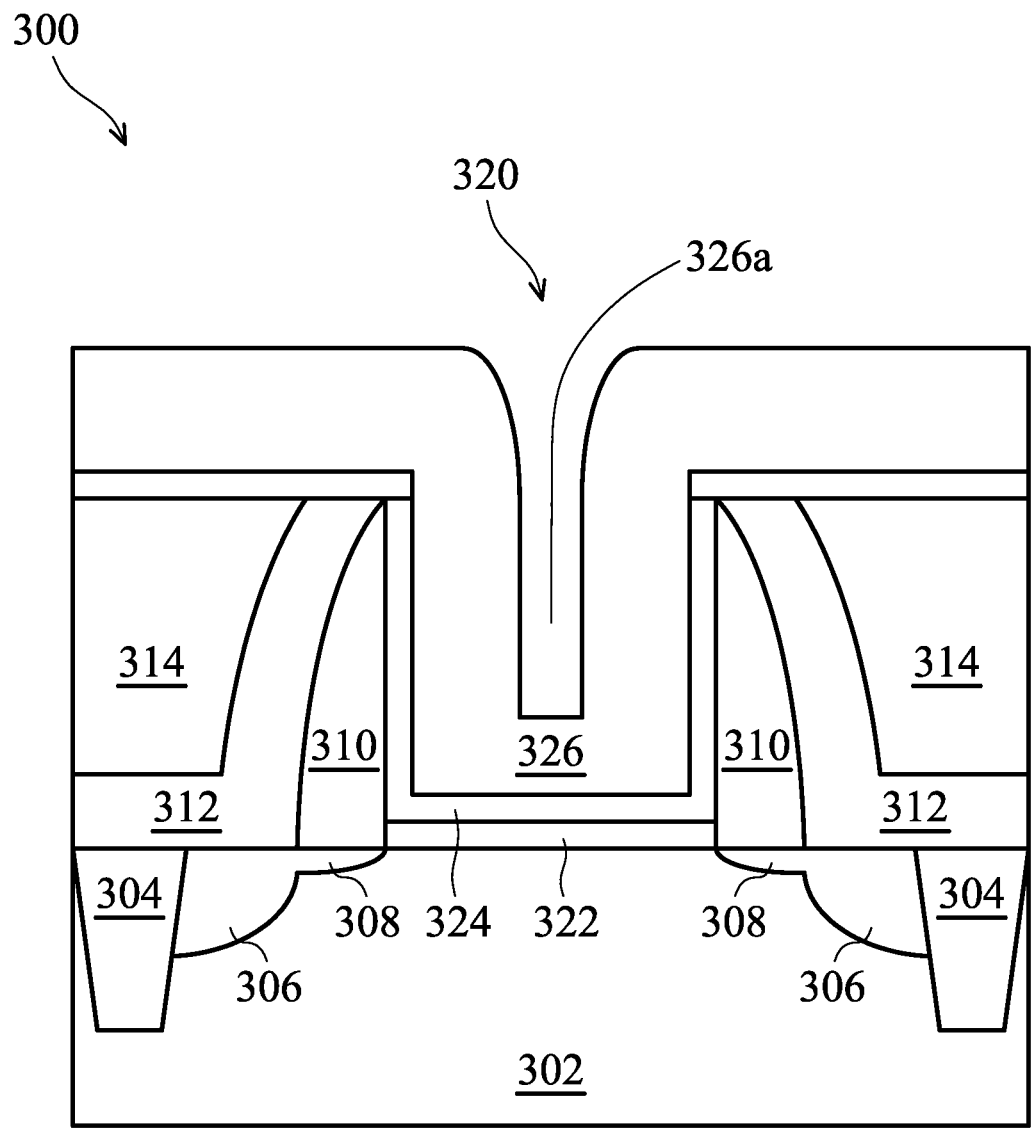
Figure 3C:
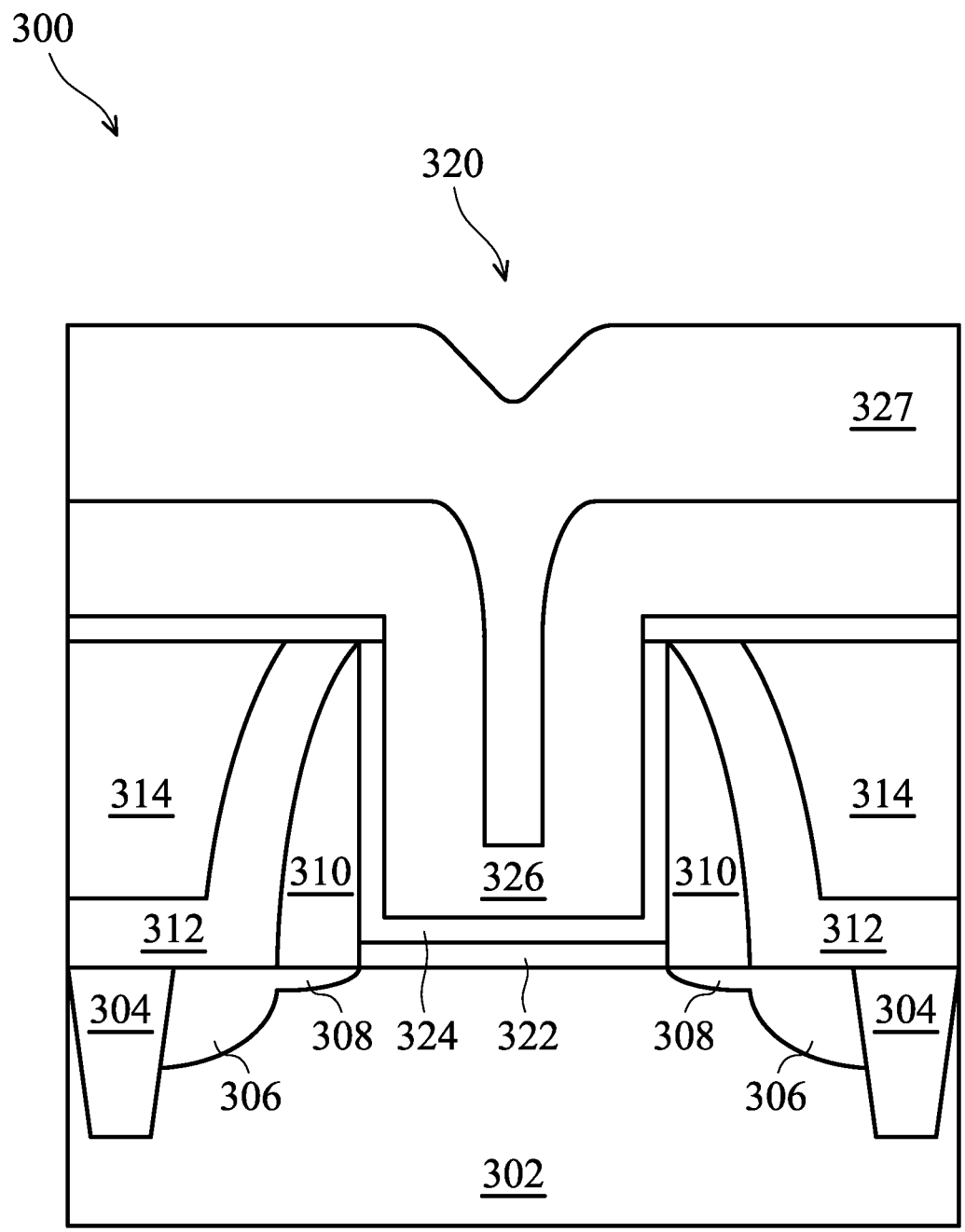
Figure 3D:
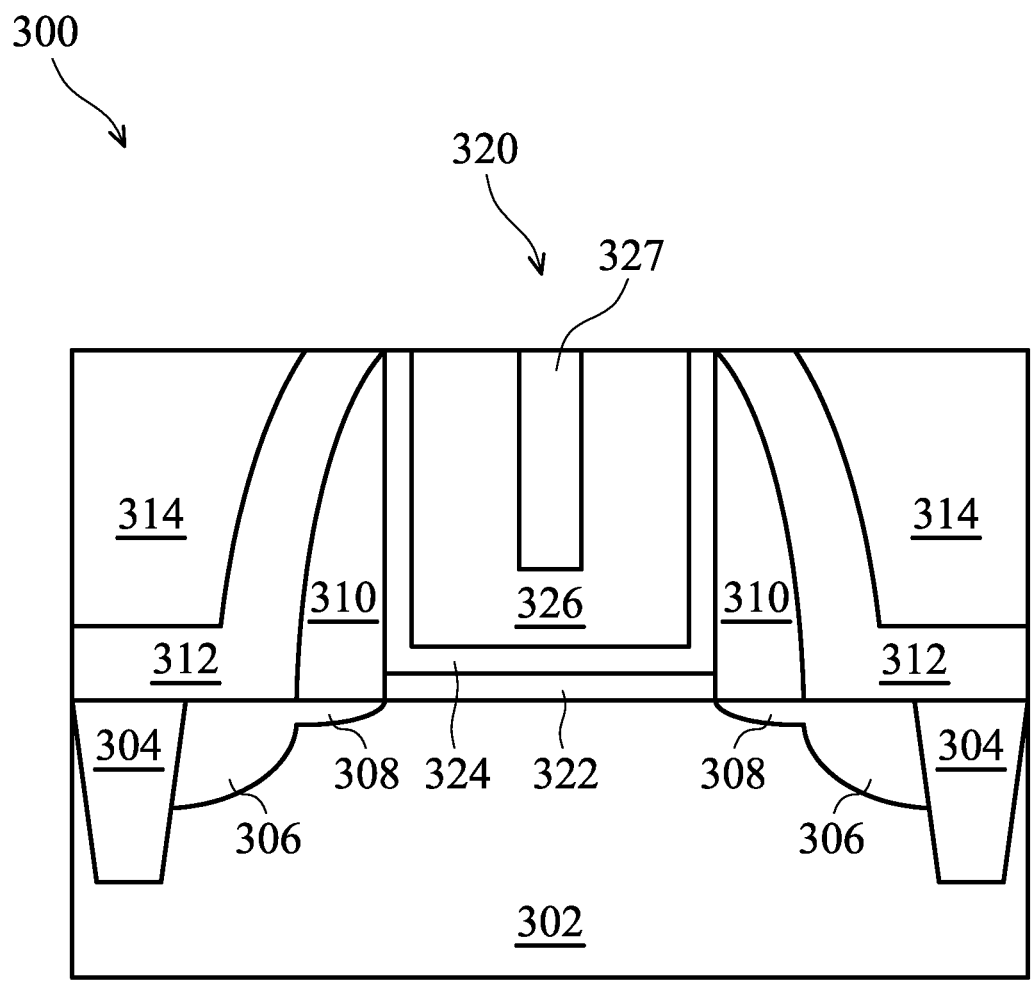
Figure 3E:
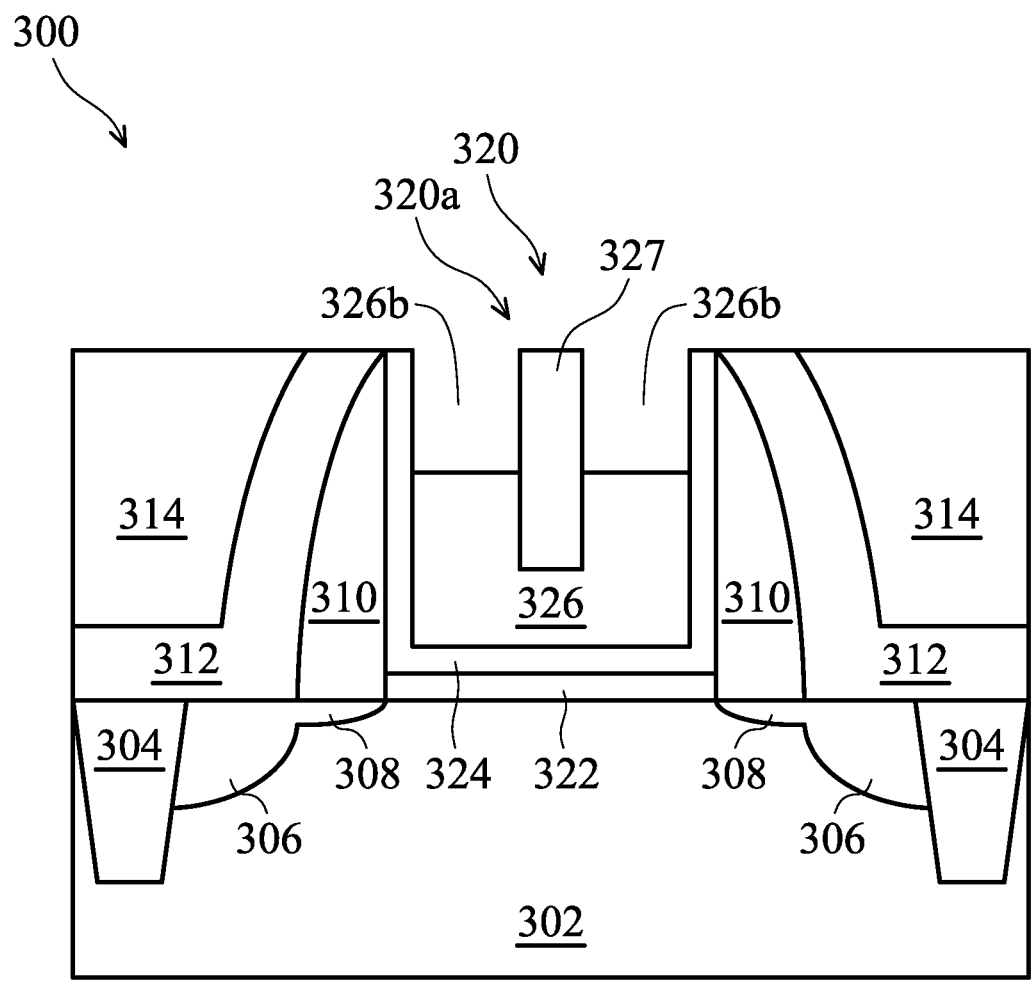
Figure 3F:
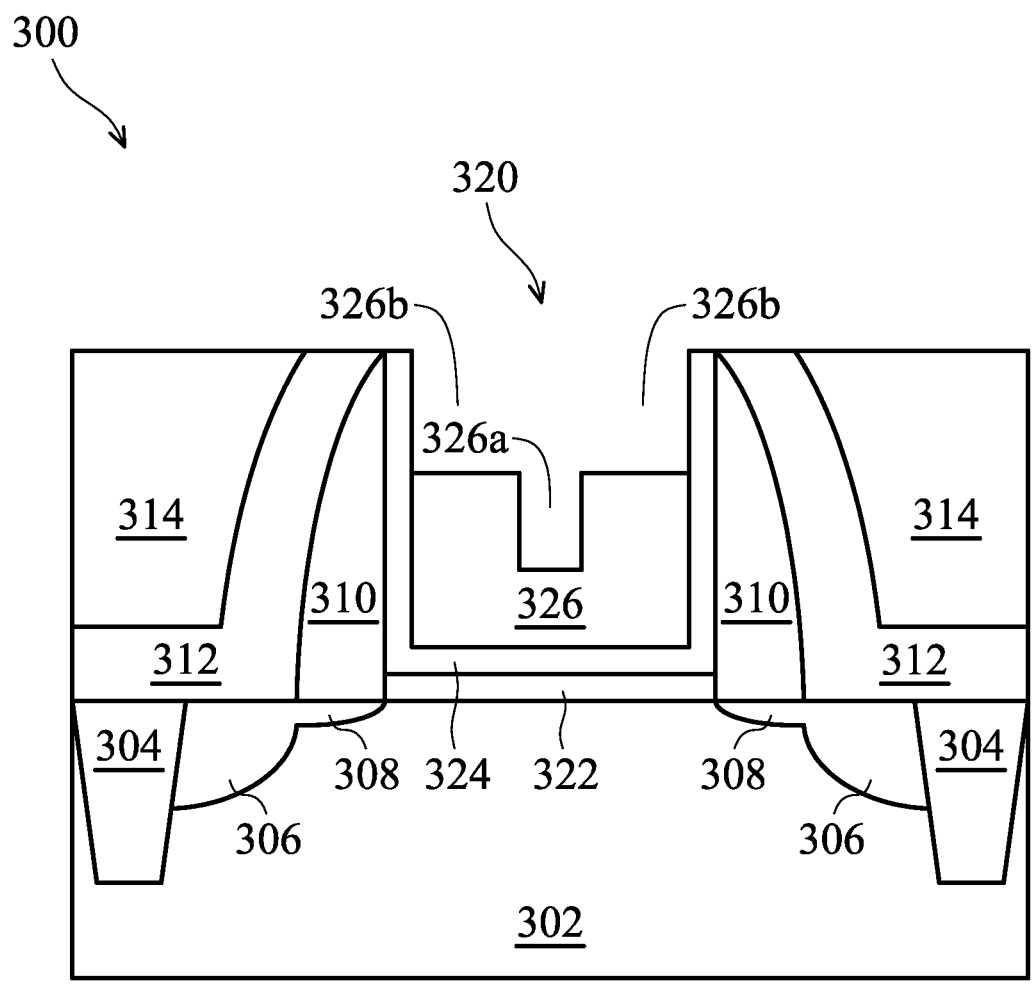
Figure 3G:
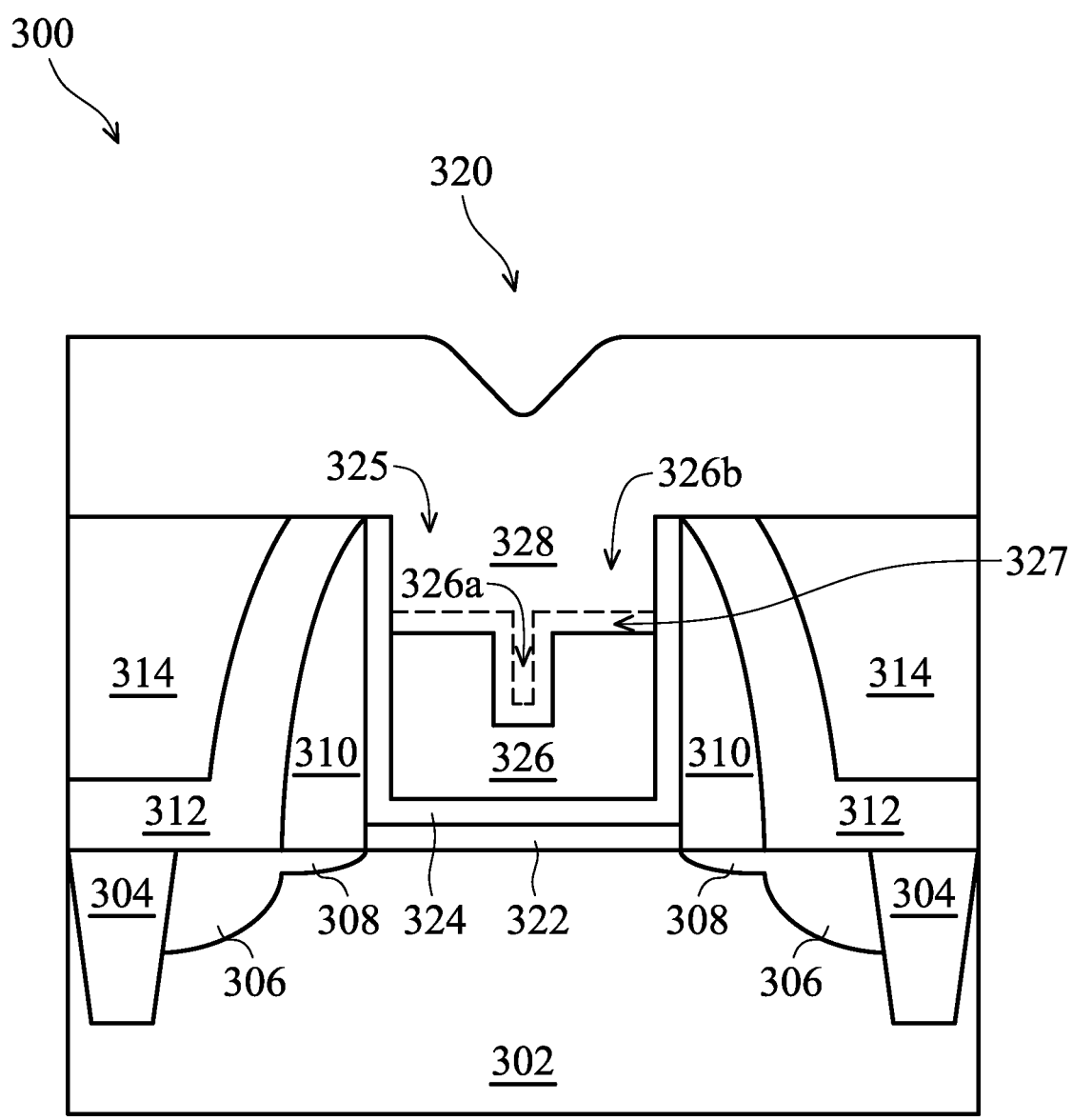
Figure 3H:
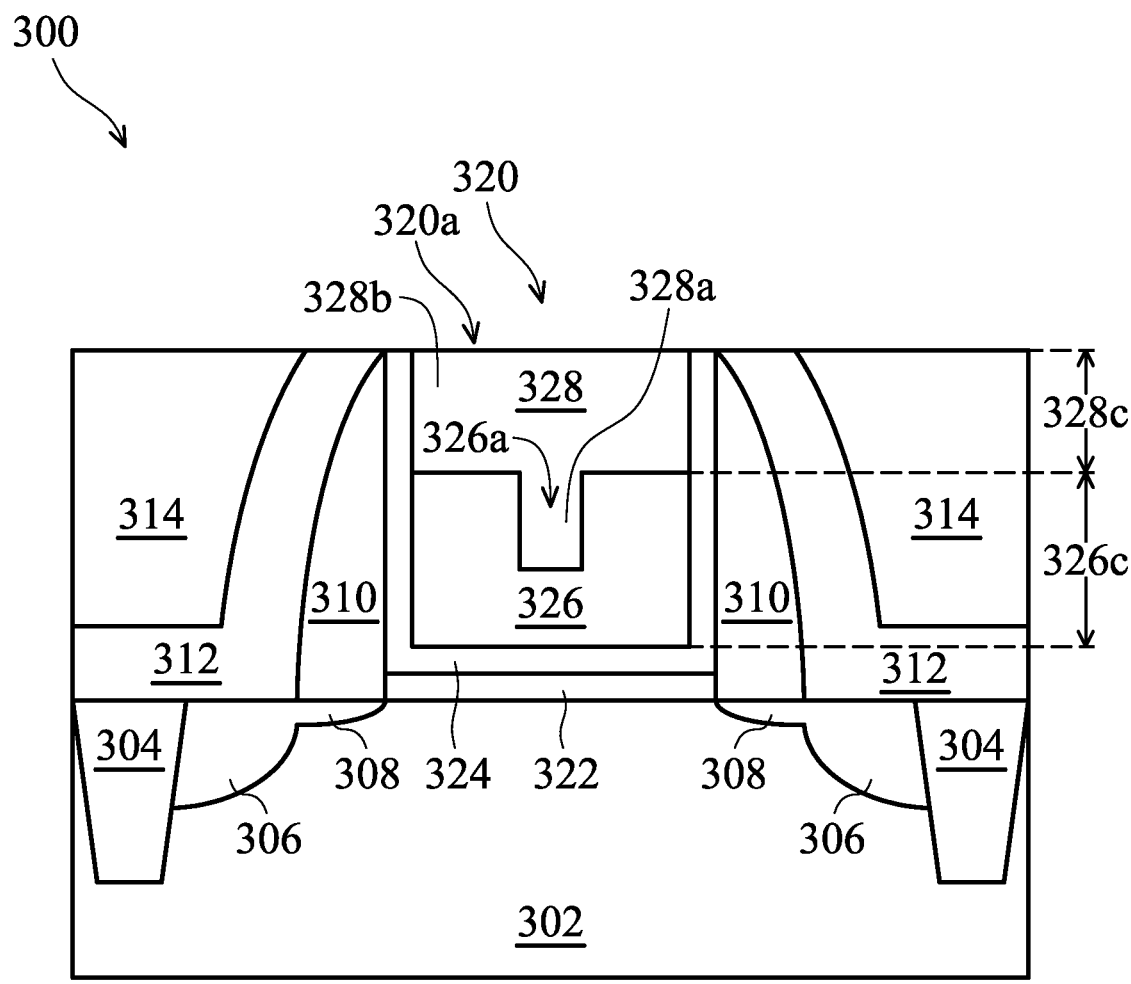

With reference to FIGS. 2 through 3H, a method 200 and a Field Effect Transistor (FET) 300 are collectively described below. FIG. 2 is a flowchart illustrating a method 200 for fabricating a gate structure 320 according to various aspects of the present disclosure. FIGS. 3A-H show schematic cross-sectional views of a gate structure 320 at various stages of fabrication according to an embodiment of the method of FIG. 2. It is noted that part of the FET 300 may be fabricated with complementary metal-oxide-semiconductor (CMOS) technology processing. Accordingly, it is understood that additional processes may be provided before, during, and after the method 200 of FIG. 2, and that some other processes may only be briefly described herein. Also, FIGS. 2 through 3H are simplified for a better understanding of the inventive concepts of the present disclosure. For example, although the figures illustrate a gate structure 320 for the FET 300, it is understood the IC may comprise a number of other devices comprising resistors, capacitors, inductors, fuses, etc.

Referring to FIGS. 2 and 3A, the method 200 begins at step 202 wherein a semiconductor substrate 302 comprising a trench 325 of a gate structure 320 is provided. The semiconductor substrate 302 may comprise a silicon substrate. The substrate 302 may alternatively comprise silicon germanium, gallium arsenic, or other suitable semiconductor materials. The substrate 302 may further comprise other features such as various doped regions, a buried layer, and/or an epitaxy layer. Furthermore, the substrate 302 may be a semiconductor on insulator such as silicon on insulator (SOI). In other embodiments, the semiconductor substrate 302 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

The semiconductor substrate 302 may comprises an active region 303 and isolation regions 304. The active region 303 may include various doping configurations depending on design requirements as known in the art. In some embodiments, the active region 303 may be doped with p-type or n-type dopants. For example, the active region 303 may be doped with p-type dopants, such as boron or $BF_2$; n-type dopants, such as phosphorus or arsenic; and/or combinations thereof. The active region 303 may be configured for an N-type metal-oxide-semiconductor transistor (referred to as an NMOS) or for a P-type metal-oxide-semiconductor transistor (referred to as a PMOS).

The isolation regions 304 may be formed on the substrate 302 to isolate the various active regions 303. The isolation regions 304 may utilize isolation technology, such as local oxidation of silicon (LOCOS) or shallow trench isolation (STI), to define and electrically isolate the various active regions 303. In the present embodiment, the isolation region 304 includes a STI. The isolation regions 304 may comprise silicon oxide, silicon nitride, silicon oxynitride, fluoride-doped silicate glass (FSG), a low-k dielectric material, other suitable materials, and/or combinations thereof. The isolation regions 304, and in the present embodiment, the STI, may be formed by any suitable process. As one example, the formation of the STI may include patterning the semiconductor substrate 302 by a conventional photolithography process, etching a trench in the substrate 302 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

It is noted that the FET 300 may undergo a "gate last" process and other CMOS technology processing to form various features of the FET 300. As such, the various features are only briefly discussed herein. The various components of the FET are formed prior to formation of the gate structure 320 in a "gate last" process. The various components may comprise source/drain (n-type and p-type S/D) regions 306 and lightly doped source/drain regions (n-type and p-type LDD) 308 in the active region 303 on opposite sides of the gate structure 320. The n-type S/D 306 and LDD 308 regions may be doped with P or As, and the p-type S/D 306 and LDD 308 regions may be doped with B or In. The various features may further comprise gate spacers 310, contact etch stop layer (CESL) 312, and an interlayer dielectric (ILD) layer 314 on opposite sidewalls of the gate structure 320. The gate spacers 310 may be formed of silicon oxide, silicon nitride or other suitable materials. The CESL 312 may be formed of silicon nitride, silicon oxynitride, or other suitable materials. The ILD 314 may include an oxide formed by a high aspect ratio process (HARP) and/or high density plasma (HDP) deposition process.

In a gate last process, a dummy gate structure (not shown), such as dummy poly-silicon, is initially formed and may be followed by CMOS technology processing until deposition of an ILD 314. A chemical mechanical polishing (CMP) is performed on the ILD 314 to expose the dummy gate structure. The dummy gate structure may then be removed thereby forming an opening. It is understood that the above examples do not limit the processing steps that may be utilized to form the dummy gate structure. It is further understood that the dummy gate structure may comprise additional dielectric layers and/or conductive layers. For example, the dummy gate structure may comprise hard mask layers, interfacial layers, capping layers, diffusion/barrier layers, other suitable layers, and/or combinations thereof.

Still referring to FIG. 3A, a gate dielectric layer 324 may be deposited to partially fill in the opening to form a trench 325.

In some embodiments, the gate dielectric layer 324 may comprise silicon oxide, silicon oxynitride, high-k dielectric layer or combination thereof. The high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the high-k gate dielectric has a thickness less than 2 nm in the opening. The gate dielectric layer 324 may further comprise an interfacial layer 322 to reduce damages between the gate dielectric layer 324 and the substrate 302. The interfacial layer 322 may comprise silicon oxide, silicon oxynitride, Hf-silicate or $Al_2O_3$ based dielectric.

Conventionally, the trench 325 is then filled with various metal layers and metal patterning may be performed to provide the proper metal layers for the FET 100. A CMP is performed to remove the various metal layers outside of the trench 325 to form the multilayered metal gate electrode 120a of the FET 100. Alternatively, it can also be performed via dry or wet etching process. It has been observed that the multilayered metal gate electrode 120a of the FET 100 exhibits high gate resistance because lower resistance metal layer 128 occupies a small ratio of the multilayered metal gate electrode 120a by area. This can increase RC delay of the IC and degrade device performance. Accordingly, the processing discussed below with reference to FIGS. 2 and 3B-3H modifies the multilayered metal gate electrode 120a to form a gate structure 320 to reduce the gate resistance by one order of magnitude. This can reduce RC delay of the IC and upgrade device performance.

Referring to FIGS. 2 and 3B, the method 200 continues with step 204 in which a first metal material 326 having a first recess 326a is deposited to partially fill the trench 325. The first metal material 326 comprises a stacked material selected from a group of Ti, Ta, W, TiAl, Co, alloys or compound metals that contains C and/or N. The first metal material 326 may be formed by CVD, PVD or other suitable technique. The first metal material 326 has a first resistance. The first metal material 326 has a thickness ranging from 30 to 150 angstroms. The first metal material 326 may comprise a laminate stack comprising work function metal. In one embodiment, the first metal material 326 for a NMOS may comprise Ti, Ta, TiAl, and alloy or compound that contains C and/or N work function metal. In another embodiment, the first metal material 326 for a PMOS may comprise Ti, Ta, Co and alloy or compound that contains C and/or N work function metal. In some embodiment, the laminate may further comprise a barrier metal layer, a liner metal layer or a wetting metal layer.

Referring to FIGS. 2 and 3C, the method 200 continues with step 206 in which a sacrificial layer 327 may be deposited over the first metal material 326 to fill first recess 326a and the trench 325. The sacrificial layer 327 may comprise, but is not limited to, poly-silicon, photo-resist (PR) or Spin-on dielectric. The sacrificial layer 327 may be formed by CVD, PVD, ALD, spin-on or other suitable technique. The thickness of the sacrificial layer 327 will depend on depth of the first recess 326a and the trench 325. Accordingly, the sacrificial layer 327 is deposited until the first recess 326a and the trench 325 is substantially filled.

Referring to FIGS. 2 and 3D, the method 200 continues with step 208 in which a CMP process is performed to remove a portion of the sacrificial layer 327, the first metal material 326, and the gate dielectric layer 324 outside of the trench 325. Accordingly, the CMP process may stop when reaching the ILD 314, and thus providing a substantially planar surface. Alternatively, this can be achieved via a combination of dry and/or wet process.

Referring to FIGS. 2 and 3E, the method 200 continues with step 210 in which an upper portion of the first metal material 326 is removed by an etching process to form a second recess 326b of the first metal material 326. The etching process may include a dry etching process and/or a wet etching process. For example, the wet etching chemistry may include SC-1 or SPM, possibly with some oxidizing agents such as H2O2, performed at a temperature below 70° C. to selectively remove the upper portion of the first metal material 326. For example, the dry etching chemistry may include BC13 to selectively remove the upper portion of the first metal material 326. The etching process forms the second recess 326b of the first metal material 326 within the trench 325. The second recess 326b of the first metal material 326 within the trench 325 may have a depth ranging from about 50 to about 2700 angstroms. The depth can be achieved through tuning various parameters of the etching process such as time and etching chemistry.

Moreover, the sacrificial layer 327 may not serve as a protection layer in the etching processes unless the ratio of the removal rates is sufficiently large. In one embodiment, a ratio of removal rates by the etchants of the first metal material 326 and the sacrificial layer 327 is preferably greater than 10. Furthermore, if the gate dielectric layer 324 is damaged by the etchants, it will act as a source of defects in subsequent processes thereby increasing the likelihood of electrical leakage. In one embodiment, a ratio of removal rates by the etchants of the first metal material 326 and the gate dielectric layer 324 is preferably greater than 20. In the present embodiment, a remained portion of the first metal material 326 within the trench 537 forms a lower portion of a modified metal gate electrode 320a. The lower portion is substantially U-shaped.

Referring to FIGS. 2 and 3F, the method 200 continues with step 212 in which the sacrificial layer 327 remaining within the trench 325 is removed by another etching process to expose the first recess 326a of the first metal material 326. The etching process may include a dry etching process and/or a wet etching process. For example, the dry/wet etching chemistry may include F, Cl, and Br based etchants to selectively remove the sacrificial layer 327 remaining within the trench 325. If the first metal material 326 adjacent to first recess 326a is attacked by the etchants, the work function of the metal may be changed thereby increasing the likelihood of device failure. In one embodiment, a ratio of removal rates by the etchants of the sacrificial layer 327 and the first metal material 326 is preferably greater than 10.

Referring to FIGS. 2 and 3G, the method 200 continues with step 214 in which a second metal material 328 is deposited over the first metal material 326 to fill the first and second recesses 326a, 326b of the first metal material 326. The first and second recesses 326a, 326b of the first metal material 326 are hereinafter referred to as the upper portion of the trench 325. In one embodiment, an optional barrier layer may be formed over the first metal material 326 to partially fill the upper portion of the trench 325 before deposition of the second metal material 328. The barrier layer may comprise a material selected from a group of Ti, Ta, TiN, TaN and WN. The thickness of the barrier layer ranges from about 5 angstroms to about 50 angstroms. The barrier layer may be formed by CVD, PVD, ALD, or other suitable technique. In some embodiments, the barrier layer is not used since it also has relative high resistance.

Still referring to FIGS. 2 and 3G, the second metal material 328 is deposited over the first metal material 326 to fill the upper portion of the trench 325. In the present embodiment, the second metal material 328 may comprise a material selected from a group of Al, Cu, Co and W. The second metal material 328 may be formed by CVD, PVD, plating, spin-on, ALD, or other suitable technique. The second metal material 328 has a second resistance. The second resistance is lower than the first resistance. For example, electrical resistivity of the Al (about 2.65 $\mu\Omega$-cm) is less than electrical resistivity of the TiN (about 200 $\mu\Omega$-cm). The thickness of the second metal material 328 will depend on the depth of upper portion of the trench 325. Accordingly, the second metal material 328 is deposited until upper portion of the trench 325 is substantially filled.

Referring to FIGS. 2 and 3H, the method 200 continues with step 216 in which a CMP is performed to remove portion of the second metal material 328 outside of the trench 325. Accordingly, the CMP process may stop when reaching the ILD 314, and thus providing a substantially planar surface. Following the CMP, a remained portion of the second metal material 328 within the trench 325 forms an upper portion of the modified metal gate electrode 320a. The second metal material 328 may comprise a protrusion 328a extending into the first recess 326a of the first metal material 326. The second metal material 328 further comprises a metal strip 328b extending into the second recess 326b of the first metal material 326 and is substantially T-shaped.

Figure 1:
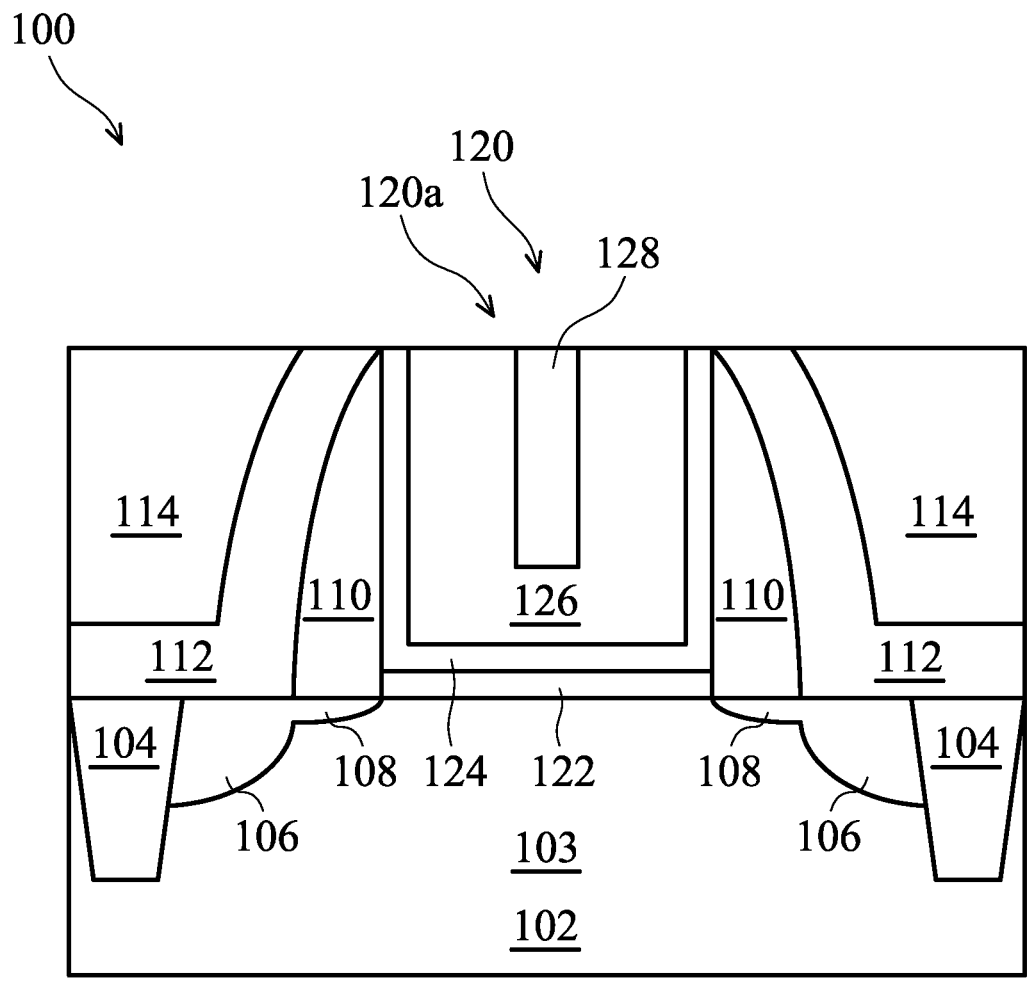
FIG. 1 shows a cross-sectional view of a conventional gate structure for a Field Effect Transistor.

The modified metal gate electrode 320a comprises the lower portion formed of the first metal material 326 having the first recess 326a and the first resistance. The lower portion is substantially U-shaped. It is to be understood that the invention is not limited to the above embodiment. The lower portion may be substantially L-shaped or other shape. The lower portion has a maximum height 326c ranging from 300 to 2900 angstroms. The lower portion has a minimum height 326d ranging from 30 to 150 angstroms. The modified metal gate electrode 320a further comprises the upper portion formed of the second metal material 328 having the protrusion 328a extending into recess 326a and the second resistance. The upper portion further comprises the metal strip 328b and is substantially T-shaped. It is to be understood that the invention is not limited to the above embodiment. The upper portion may be substantially L-shaped or other shape. The upper portion has a minimum height 328c ranging from 50 to 2700 angstroms. Additionally, the protrusion 328a extends into the recess 326a. The second resistance is lower than the first resistance. As compared with the conventional metal gate electrode 120a shown in FIG. 1, the upper portion 328 with lower resistance occupies a larger ratio of the modified metal gate electrode 320a by area. Therefore, the modified metal gate electrode 320a has lower gate resistance than the conventional metal gate electrode 120a. The lower gate resistance can decrease RC delay of the circuit and upgrade device performance.

It is understood that the FET 300 may undergo further CMOS process flow to form various features such as contacts/vias, interconnect metal layers, dielectric layers, passivation layers, etc. It has been observed that the modified metal gate electrode 320a used as the gate contact material reduces the gate resistance of the NMOS and PMOS.

One aspect of this description relates to a method of making a gate structure. The method includes forming a trench in a dielectric layer. The method further includes forming a gate dielectric layer in the trench. The gate dielectric layer defines an opening in the dielectric layer. The method further includes forming a gate electrode in the opening. Forming the gate electrode includes filling a width of a bottom portion of the opening with a first metal material having a first resistance, wherein the first metal material has a recess. Forming the gate electrode further includes filling an entire width of a top portion of the opening with a homogeneous second metal material having a second resistance less than the first resistance, wherein the homogeneous second metal material has a protrusion extending into the recess, and a maximum width of the homogeneous second metal material is equal to a maximum width of the first metal material. A top surface of the gate dielectric layer is co-planar with a top surface of the homogeneous second metal material.

Another aspect of this description relates to a method of making a transistor. The method includes forming a trench in a dielectric layer exposing an active region of a substrate. The method further includes forming a gate structure in the trench. Forming the gate electrode includes forming a gate dielectric in the trench. Forming the gate electrode further includes filling a width of a bottom portion of the trench with a first metal material and having a first resistance, wherein the first metal material comprises a recess. Forming the gate electrode further includes filling an entire width of the trench above the first metal material with a homogeneous second metal material and having a second resistance less than the first resistance. The homogeneous second metal material comprises a protrusion extending into the recess, and a thickness of the protrusion is equal to a thickness at a periphery of the homogeneous second metal material. A maximum width of the homogeneous second metal material is equal to a maximum width of the first metal material, and a top surface of the gate dielectric is co-planar with a top surface of the homogeneous second metal material.

Still another aspect of this description relates to a method of making a gate structure. The method includes forming a trench in a layer over a substrate. The method further includes forming a gate structure in the trench. Forming the gate structure includes forming a lower portion of a gate electrode filling a width of a bottom portion of the trench, the lower portion comprising a first metal material having a first resistance, wherein a central portion of the lower portion has a thickness at least 50% less than a thickness of a peripheral portion of the lower portion located adjacent sidewalls of the trench. Forming the gate structure further includes forming an upper portion of the gate electrode filling an entire width of a top portion of the trench, the upper portion comprising a homogeneous second metal material having a second resistance lower than the first resistance, wherein a maximum width of the upper portion of the gate electrode is equal to a maximum width of the lower portion of the gate electrode. The method further includes forming a gate dielectric layer surrounding the gate electrode, wherein a top surface of the gate dielectric layer is co-planar with a top surface of the homogeneous second metal material.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate a metal gate structure for Field-Effect Transistors. In this way, a metal gate electrode of a gate structure has lower gate resistance.

What is claimed is:

1. A method of making a gate structure, the method comprising:
   forming a trench in a dielectric layer;
   forming a gate dielectric layer in the trench, wherein the gate dielectric layer defines an opening in the dielectric layer; and
   forming a gate electrode in the opening, wherein forming the gate electrode comprises:
      filling a width of a bottom portion of the opening with a first metal material having a first resistance, wherein the first metal material has a recess; and
      filling an entire width of a top portion of the opening with a homogeneous second metal material having a second resistance less than the first resistance, wherein the homogeneous second metal material has a protrusion extending into the recess, and a maximum width of the homogeneous second metal material is equal to a maximum width of the first metal material,
   wherein a top surface of the gate dielectric layer is co-planar with a top surface of the homogeneous second metal material.

2. The method of claim 1, wherein filling the width of the bottom portion comprises forming the first metal material having a maximum thickness ranging from 300 angstroms to 2900 angstroms.

3. The method of claim 1, wherein filling the entire width of the top portion comprises forming the homogeneous second metal material having a minimum thickness ranging from 50 angstroms to 2700 angstroms.

4. The method of claim 1, wherein filling the width of the bottom portion comprises forming the first metal material having a minimum thickness ranging from 30 angstroms to 150 angstroms.

5. The method of claim 1, further comprises forming an interfacial layer between the gate dielectric layer and a substrate.

6. The method of claim 1, wherein filling the width of the bottom portion comprises forming the first metal material comprising at least one of Ti, Ta, W, TiAl, Co, alloys or compound metals that contains at least one of C or N.

7. The method of claim 1, wherein filling the entire width of the top portion comprises forming the homogeneous second metal material selected from the group consisting of Al, Cu, Co and W.

8. The method of claim 1, further comprising forming a barrier layer between the homogeneous second metal material and the first metal material.

9. A method of making a transistor, the method comprising:
   forming a trench in a dielectric layer exposing an active region of a substrate;
   forming a gate structure in the trench, wherein forming the gate electrode comprises:
      forming a gate dielectric in the trench;
      filling a width of a bottom portion of the trench with a first metal material and having a first resistance, wherein the first metal material comprises a recess; and
      filling an entire width of the trench above the first metal material with a homogeneous second metal material and having a second resistance less than the first resistance, wherein the homogeneous second metal material comprises a protrusion extending into the recess, and a thickness of the protrusion is equal to a thickness at a periphery of the homogeneous second metal material, and a maximum width of the homogeneous second metal material is equal to a maximum width of the first metal material, and a top surface of the gate dielectric is co-planar with a top surface of the homogeneous second metal material.

10. The method of claim 9, wherein filling the width of the of the bottom portion comprises forming a laminate comprising a work function metal.

11. The method of claim 10, wherein forming the laminate comprises forming a material selected from the group consisting of TiN, Ta, TaN, and WN.

12. The method of claim 9, wherein forming the gate dielectric comprises forming a high-k dielectric layer in the trench.

13. The method of claim 9, further comprising forming an interfacial layer between the gate dielectric and the substrate.

14. The method of claim 13, forming the interfacial layer comprises forming the interfacial layer comprising at least one of silicon oxynitride, Hf-silicate, or an aluminum oxide based dielectric.

15. The method of claim 9, wherein filling the width of the bottom portion comprises:
   partially filling the trench with the first metal material;
   filling the recess with a sacrificial material;
   removing a top portion of the first metal material; and
   removing the sacrificial material.

16. The method of claim 15, wherein filling the recess with the sacrificial material comprises filling the recess with the sacrificial material comprising at least one of polysilicon, photo-resist, or spin-on dielectric.

17. The method of claim 15, wherein removing the top portion of the first metal material comprises etching the first metal material using a wet etching chemistry comprising SC-1 or SPM.

18. The method of claim 17, wherein etching the first metal material comprises using the wet etching chemistry further comprising oxidizing agents.

19. A method of making a gate structure, the method comprising:
   forming a trench in a layer over a substrate; and
   forming a gate structure in the trench, forming the gate structure comprising:
      forming a lower portion of a gate electrode filling a width of a bottom portion of the trench, the lower portion comprising a first metal material having a first resistance, wherein a central portion of the lower portion has a thickness at least 50% less than a thickness of a peripheral portion of the lower portion located adjacent sidewalls of the trench; and
      forming an upper portion of the gate electrode filling an entire width of a top portion of the trench, the upper portion comprising a homogeneous second metal material having a second resistance lower than the first resistance, wherein a maximum width of the upper portion of the gate electrode is equal to a maximum width of the lower portion of the gate electrode; and
   forming a gate dielectric layer surrounding the gate electrode, wherein a top surface of the gate dielectric layer is co-planar with a top surface of the homogeneous second metal material.

20. The method of claim 19, further comprising forming a bather layer between the first metal material and the homogeneous second metal material, wherein the barrier layer comprises a material selected from the group consisting of Ti, Ta, TiN, TaN and WN.

* * * * *